United States Patent [19]
Pfeil

[11] Patent Number: 6,087,759
[45] Date of Patent: Jul. 11, 2000

[54] POST-ASSEMBLY PROCESSED CRYSTAL RESONATOR WITH CONDUCTIVE LAYERS SUITABLE FOR SURFACE MOUNTING

[75] Inventor: Gerhard Pfeil, Sinsheim, Germany

[73] Assignee: Tele Quarz GmbH, Neckarbischofsheim, Germany

[21] Appl. No.: 09/308,599

[22] PCT Filed: Nov. 14, 1997

[86] PCT No.: PCT/EP97/06363

§ 371 Date: May 19, 1999

§ 102(e) Date: May 19, 1999

[87] PCT Pub. No.: WO98/24178

PCT Pub. Date: Jun. 4, 1998

[30] Foreign Application Priority Data

Nov. 28, 1996 [DE] Germany .......................... 196 49 332

[51] Int. Cl.⁷ ............................................... H03H 9/15
[52] U.S. Cl. ......................... 310/321; 310/348; 29/25.35
[58] Field of Search ................................. 310/348, 366, 310/321; 29/25.35

[56] References Cited

U.S. PATENT DOCUMENTS

| | | |
|---|---|---|
| 4,293,986 | 10/1981 | Kobayashi et al. . |
| 4,362,961 | 12/1982 | Gerber .................................... 310/370 |
| 4,421,621 | 12/1983 | Fujii et al. .......................... 204/192.12 |
| 4,524,497 | 6/1985 | Rapps et al. ........................... 29/25.35 |
| 4,571,794 | 2/1986 | Nakamura .............................. 29/25.35 |
| 4,627,533 | 12/1986 | Pollard ................................ 331/177 R |
| 5,382,929 | 1/1995 | Inao et al. ............................... 333/187 |
| 5,394,123 | 2/1995 | Inoue et al. ............................. 333/189 |
| 5,449,965 | 9/1995 | Tsuru ..................................... 310/351 |
| 5,699,027 | 12/1997 | Tsuji et al. .............................. 333/193 |
| 5,801,603 | 9/1998 | Yamamoto et al. .................... 333/189 |
| 5,925,968 | 7/1999 | Yachi et al. ............................. 310/320 |
| 5,939,956 | 8/1999 | Arimura et al. ........................ 333/189 |
| 5,945,774 | 8/1999 | Shih et al. .............................. 310/348 |

FOREIGN PATENT DOCUMENTS

| | | | |
|---|---|---|---|
| 2055232 | 2/1981 | United Kingdom | G04G 3/00 |
| 2282260 | 3/1995 | United Kingdom | H03H 9/15 |
| 84/00082 | 1/1984 | WIPO | H01L 41/22 |

OTHER PUBLICATIONS

Shanley et al., DC Plasma Anodization of Quartz Resonators, 36th Annual Frequncy Symposium, 1982.

*Primary Examiner*—Nestor Ramirez
*Assistant Examiner*—Eliza Stefaniw
*Attorney, Agent, or Firm*—Paul Vincent

[57] ABSTRACT

The invention concerns a resonator (1) with at least one crystal (2, 2'), at least two electrodes (3, 3', 4, 4') exciting the crystal (2, 2'), and a sandwich housing (5, 5') with a substantially plate-shaped bottom (6), at least one frame-like central portion (7, 7') which surrounds the crystal (2, 2') and supports it in a pendular fashion, and a substantially plate-shaped lid (8), wherein these housing sections (6, 7, 7', 8) are interconnected by means of sealing surfaces (13, 14, 15, 16), with the inclusion of conducting layers (9 and 9', 10 and 10'; 11, 12) and each electrode (3, 4; 3', 4') is connected to conductive layers (9 and 9', 10 and 10';11, 12). The resonator in accordance with the invention is configured in such a fashion that it can be further processed using SMD technology. Towards this end, at least two conductive surfaces (17, 18, 19, 20) extend on at least one side of the housing (5, 5') to the foot (21) of the bottom (6) in such a manner that the bottom can be soldered to a printed circuit (22), wherein each of the conductive layers (9 and 9', 10 and 10'; 11, 12) are interrupted outside of the sealing surfaces (13, 14, 15, 16) for electrical isolation.

37 Claims, 8 Drawing Sheets

POST-ASSEMBLY PROCESSED CRYSTAL RESONATOR WITH CONDUCTIVE LAYERS SUITABLE FOR SURFACE MOUNTING

BACKGROUND OF THE INVENTION

The invention concerns a resonator with at least one crystal, at least two electrodes exciting this crystal and a housing constructed in a sandwich-like manner having a substantially plate-shaped bottom, at least a frame-shaped central portion which surrounds the crystal and supports same in a vibration-capable fashion and a substantially plate-shaped lid, wherein these housing components are connected to each other by means of sealing surfaces with the inclusion of conducting layers and each electrode is electrically connected to one conducting layer. The invention also concerns a method for the production of a resonator of this kind.

The invention also concerns a method for the production of a resonator (1,1') having at least one central portion (7,7') made from a crystal plate having two electrodes (3,3,4,4') as well as a bottom (6) and a lid (8), having the following method steps;

a) the active crystal surface (2,2') is freed in such a fashion that at least one connecting brace (28,29,30) to the central portion (7,7') created thereby, remains,
b) the active crystal surface (2,2') is processed in such a fashion that the desired mechanical dimensioning is achieved,
c) the electrodes (3,3') are introduced and optionally processed for compensation and connected to the conducting layers (9,10,11,12), and the at least one central portion (7,7'), the bottom (6) and the lid (8) are joined together.

Present day conventional resonators comprise piezoelectrical crystal elements mounted in hermetically sealed housings, primarily made from glass, metal or ceramic. The crystal elements are mounted in these housings using a conducting glue to effect the electrical connection between the normally evaporated electrodes and the electrical feed-throughs or feed contacts of the housing while simultaneously effecting the mechanical connection of the crystal element to the housing. Resonators having this type of housing are relatively large components which are difficult and expensive to produce, since depressions or gaps are required which must be sufficiently large due to mechanical tolerances and the use of conducting glues.

For this reason, U.S. Pat. No. 4,293,986 proposes a configuration of the above mentioned resonator. Towards this end, a frame-shaped quartz plate surrounds the active crystal surface and is joined together with a bottom and a lid into a sandwich-shaped housing. These components contain conducting surfaces, wherein the active crystal surface is located in a free area formed by tub-shaped recesses in the bottom and in the lid. Although a reduction in size of the components is thereby achieved, these components can only be mounted with difficulty to a printed circuit. Direct soldering while effecting the necessary connections is not possible, unless one would solder the components at their narrow sides which, for reasons of stability, in particular due to the poor shock properties, is ruled out. For this reason, auxiliary structures for the production of the connectors, for example wires, are necessary. This type of component cannot be introduced onto a circuit board using SMD technology (Surface Mounted Devices).

A resonator of the above mentioned kind is also known in the art from U.S. Pat. No. 4,421,621. This resonator has a fork-shaped vibrating quartz, wherein conducting layers are partially connected to each other by means of vertical conducting surfaces, substantially via through openings. There is however no connection of the potentials to the plate shaped bottom to allow the component to be introduced onto and connected to a circuit board using SMD-technology.

It is therefore the underlying purpose of the invention to further improve a resonator of the above mentioned kind such that it can be processed using SMD technology.

SUMMARY OF THE INVENTION

This purpose is achieved in accordance with the invention in that a total of at least two conducting surfaces extend at at least one side of the housing to the foot of the bottom in such a manner that the bottom can be soldered to a printed circuit board, wherein the conducting layers are each interrupted outside of the sealing surfaces.

The purpose is also achieved by a method of the above mentioned kind with which, prior to joining together, at least one crystal plate is provided on both sides with conducting layers, wherein the active crystal surface and at least one interruption remain outside of the sealing surfaces effecting the sealed housing region, and at least the bottom is provided with at least two conducting surfaces which extend to the foot of the bottom in such a fashion that the bottom can be soldered to a circuit board, and electrical connections can be effected to the conducting surfaces of the at least one crystal plate.

The invention facilitates a hermetically sealed, inexpensive SMD component of small volume. This component is completely connected to the printed circuit board following soldering and no wires, bore holes or through contacts are required. The conducting layers serve the purpose of through contacts and preferentially simultaneously serve as sealing surfaces, wherein the potential separations outside of the sealing surfaces facilitate passage of a plurality of connections at the edge of the sandwich-like housing to connect from this location to bottom contacts for soldering to a circuit board. An SMD component is thereby created which can be connected to a plurality of differing potentials. The principal concept is thereby that each conducting layer disposed between the housing components is associated with one potential. Since these layers are electrically separated from each other, they can serve for connecting each electrode to one conductive track of the circuit board. The component is easy to manufacture and offers a large number of possible configurations as will be shown in the various embodiments and improvements.

For example, the resonator can be constructed in such a fashion that the conducting layers are located on at least one frame-shaped central portion, wherein they are connected to the bottom and to the lid to produce the sealing surfaces. These sealing surfaces, as those in the subsequent embodiments, can be produced in various ways. They can be evaporated or introduced by screen printing, chemical methods or combinations of various methods. The bottom and the lid can be glued to the frame-shaped central portion or connected thereto in other ways.

It is particularly advantageous when the lid is connected to the central portion by means of bonding (e.g. anodic bonding or diffusion bonding). Clearly, the bottom can also be connected to the central portion using bonding. In this cases, one has the advantage that metallic layers are not necessary for the lid and/or bottom; they can be directly connected to the metallic layer of the central portion. Manufacture is thereby simplified, and a durable connection achieved. For example, the lid can be made from only one glass plate which is directly connected to an aluminium layer of the central portion bearing the crystal. The same is true for the bottom which must then only be equipped with the sideward conducting layer for connection to the circuit board.

An additional embodiment provides that the bottom have an upper conducting layer connected to the corresponding conducting layer of the central portion, wherein these correspond at least in the vicinity of the sealing surface. It is equally possible for the lid to have a conducting layer connected to the corresponding layer of the central portion, wherein these also correspond at least in the vicinity of the sealing surface. Since the introduction of metal layers, e.g. onto quartz, glass or ceramic results in a very stable connection, these embodiments have the advantage that the housing elements can be soldered or welded. The conducting layer is preferentially made from a metal having a melting temperature between 240 and 600° C. In this fashion, a simple welding by means of friction-welding or laser welding is possible without damaging the individual components. It is also possible to seal the housing using vacuum underpressure. Combination procedures are conceivable such as, e.g. joining the lid and the bottom together with the quartz under vacuum and subsequently soldering or welding the metal surfaces. It is also possible to melt the metal layers together in a flow-through oven. A soldering can also be effected in such a fashion that a press holds the components together from above and below during the soldering process and simultaneously serves for the removal of heat and for sealing. Other methods of joining and connecting the housing components or combinations thereof are conceivable.

An advantageous embodiment provides that the conducting layers outside of the sealing surfaces have additional interruptions. These interruptions can be fashioned to facilitate the stacking of only as many conducting layers as are required for contact and sealing. The reason for this is that the metal layers act as coils or capacitors which can have negative influences in view of the low values thereof which are often required. Such additional interruptions can, however, also serve to introduce additional components such as conducting tracks, capacitors, coils and the like. Such components can, e.g. be evaporated using sputtering techniques. In this fashion, the resonator can be expanded into an integrated component.

It is particularly advantageous when the crystal and the frame-shaped central portion are configured as a single component, wherein the active resonator surface of the crystal is freed with the exception of at least one connecting brace. One connecting brace or two connecting braces can be disposed on one side of the active resonator surface so that an opening of approximately 350 degrees results. It is, however, also possible to connect two connecting braces at opposite sides of the active resonator surface to effect an opening of approximately two times 175 degrees. The individual configuration depends on the final properties of the desired resonator. The freeing process can be effected either mechanically, e.g. through boring or by etching processes, wherein the surfaces which are not to be etched-free are painted over prior thereto. The embodiment as a single component has the advantage that no connection of the frame-shaped central portion to the crystal is required using a foreign material, e.g. glue. This is advantageous, since such materials, in particular glue, negatively influence the durability. The use of two connecting braces, each carrying at least one electrode lead, can avoid disadvantageous shear vibrations.

The active crystal surface can be processed to achieve a change in thickness. The firm attachment of the vibrating body to a thick edge allows this body to be made thinner. This is one of the ways of creating a free space for the resonating capability of the active resonating surface. It is also a particularly economical possibility, since the processing of the crystal is in any event necessary in order to obtain the desired final frequency. These changes in thickness of the active area can be effected by etching, lapping or through laser processing, e.g. using an excimer laser. The electrodes and their electrical connections to the conducting surfaces can subsequently be deposit-evaporated. Clearly, it is also possible to process the active crystal surfaces to achieve a particular shape. For example, convex shapes for low frequency quartz can be produced by excimer lasers or using stepped etching. All of these processings of active crystal surfaces can serve to achieve the desired final dimensions and thereby final properties such as frequency, resistance, $C_0/C_1$ ratio and the like ($C_1$ is the dynamic capacitance and $C_0$ the static capacitance).

An additional embodiment provides that the conducting layer of the lid has a window in the vicinity of the crystal. The conducting layer of the bottom can also have a window in the vicinity of the crystal. In this fashion, a free space for the vibration capability of the crystal can be easily created either to create additional room for thickness changes of the crystal or instead of such a thickness change. The additional advantage of such windows is that undesirable capacitances are avoided.

An additional embodiment provides that at least one of the housing members, namely the bottom or the lid be made from a transparent material. In this fashion, it is possible to post-process one or both of the electrodes after joining the housing together to achieve a precise frequency matching using a laser or using glow discharge. For example, the bottom and/or lid can be made from glass. For processing the electrodes, a YAK laser can be utilized. The substantial advantage is that the compensation or matching can occur after the housing is sealed. In this fashion, it is possible to tune crystals having an initial precision of less than 5 ppm to achieve a precision of less than 1 ppm.

The electrodes can be disposed on the crystal, wherein they, however, do not normally cover the entire active crystal surface. An additional possibility is to introduce the electrodes onto the lower side of the lid and onto the upper side of the bottom. If a plurality of crystals are provided, it is also clearly possible for an intermediate bottom to support electrodes. Such an embodiment facilitates production of durable resonators with very good frequency stability. Such cases also permit post-processing of the electrodes in transparent housings using lasers.

The sandwich construction in accordance with the invention facilitating connection of conducting layers for a plurality of potentials to the circuit board also allows for a plurality of crystals to be introduced into the housing. Same can be disposed in such a fashion that a plurality of frame-shaped central portions are introduced between the bottom and the lid so that a plurality of resonators are "stacked" one above the other. It is thereby also possible for intermediate bottoms to be located between the frame-shaped central portions having conducting surfaces for at least establishing the electrical connection between the at least one crystal lying there above to the circuit board. It is advantageously provided that the intermediate component has a conducting layer both above and below to form the associated sealing surface which is interrupted outside of the sealing surface for potential separation. In this fashion, as already described, metal layers can be connected to each other in order to join the components together. In this fashion, a compact component having an arbitrary large number of resonators and optionally additional components can be constructed. One can provide for connecting the crystals to the circuit board using separate connectors. The structure of the conducting layers and the separation thereof can, however, also be configured in such a fashion that the individual resonators are circuited in series or in parallel.

Clearly, the resonator in accordance with the invention can be configured with a free space for vibration of the crystal using tub-shaped recesses in the bottom and lid as is known in the art. This is advantageous for producing a particularly large space.

The bottom of the resonators can have an arbitrary number of connecting surfaces for soldering to the conducting tracks of the circuit board. The only limitation is the number of conducting surfaces which can be accepted on the periphery of the housing.

All components of the housing, namely the bottom, one or more of the frame-shaped central portions and optionally the intermediate bottoms as well as the lid can be made from the same material, e.g. from the same quartz as the crystal. In this fashion, the overall component is a homogeneous material having the same expansion properties which leads to particularly stress-free characteristics, in particular during differing operating temperatures. Absence of stress means that no displacing forces and therefore no bending of the components can occur to obviate negatively influencing the vibrations.

The invention further concerns a method for the production of a resonator of the above mentioned kind. This method has the following method steps:

A crystal plate is, e.g. covered using paint or a template at locations where the active crystal surface and the interruptions for polarity separation should be located. Subsequent thereto, the non-covered surfaces are metal-coated. A similar processing is effected on the bottom, wherein the metalization produces at least two conducting surfaces which extend to the foot of the bottom in such a fashion that the bottom can thereby be soldered to a circuit board. Such layers can also be provided in the sealing region, wherein they correspond to the conducting layers of the crystal plate. The lid can also be provided with such a metallic layer, at least in the vicinity of the sealing surface of the sealed housing region.

Subsequent thereto, the active crystal surface of the crystal plate is freed in such a fashion that at least one connecting bridge remains to the frame-shaped central portion thereby created. This can be effected by means of boring, separation using a separating plate, or etching, wherein, in the latter case, a covering using a paint can also be used. After freeing the active crystal surface, all surfaces are covered with paint except for the active crystal surface so that this region can be etched to the desired frequency. Convex shapes for low frequency quartz can also be thereby produced by step-etching. Clearly, other processing techniques are also possible such as use of a laser. The crystal surface processed thereby must merely have the desired dimensions. The electrodes are subsequently introduced in such a fashion that they are connected to the conducting sealing surfaces.

The housing components are finally brought together, wherein this can be effected using glueing, soldering, binding or welding, e.g. friction welding or laser welding. The vertical conducting surfaces and optionally also the horizontal conducting surfaces of the bottom and the crystal plate, which should have the same potential, are thereby connected to each other. A connection can also be established by sealing the components using vacuum underpressure. A combination of methods is particularly advantageous, e.g. such as joining the lid and the bottom together with the crystal plate under vacuum and subsequently soldering or welding the metallic surfaces. The previously effected vacuum seal protects the quartz and there is no large risk that the vacuum seal fails. The solder can, e.g. be heated using a laser, or a press can be provided to hold the components together from above and below during the soldering process while simultaneously serving to extract heat, and for sealing.

When the housing is transparent, e.g. made entirely from glass, a laser or a glow discharge can be used to post-process at least one of the electrodes through the transparent housing portion after joining together the housing to thereby achieve a particularly high precision, as described above.

The invention is described below with reference to the drawing. Embodiments are shown with advantageous configurations and improvements suggest additional advantages.

BRIEF DESCRIPTION OF THE DRAWING

Unless otherwise indicated, the same reference symbols in the various figures and embodiments represent the same structure

DESCRIPTION OF THE PREFERRED EMBODIMENT

Figure 1:
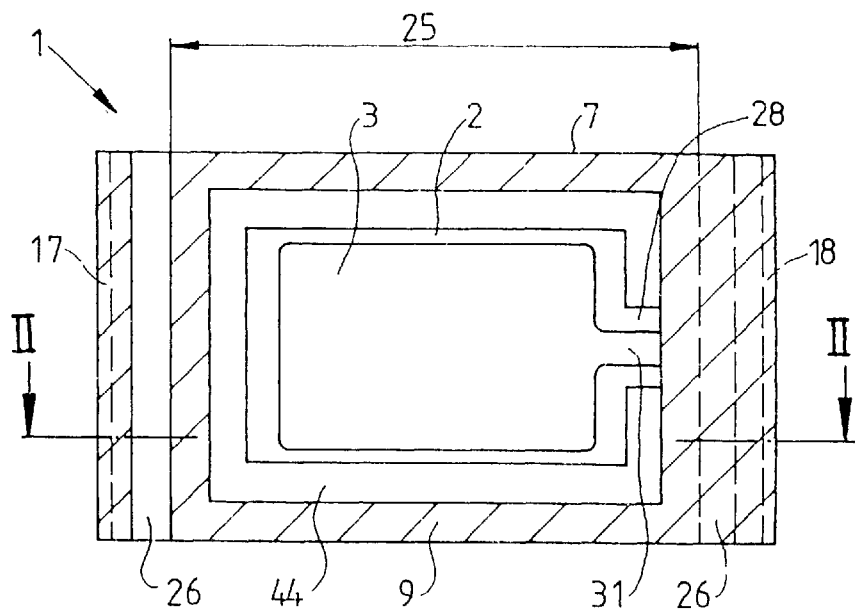
FIG. 1 shows a cut through a first embodiment of the resonator type in accordance with the invention in the vicinity of a frame-shaped central portion having an active crystal surface.
Figure 2:
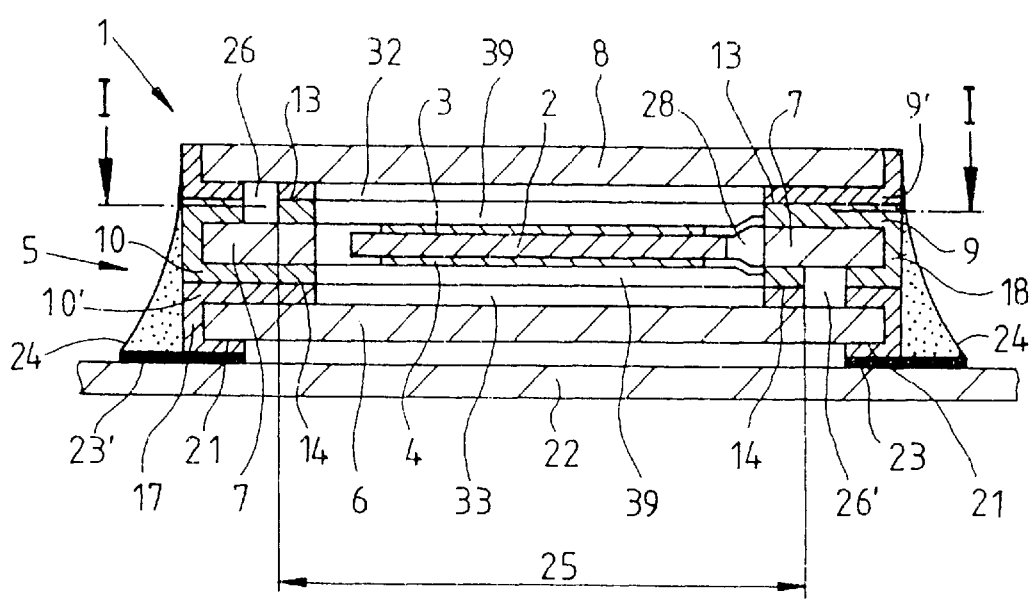
FIG. 2 shows a longitudinal cut through this embodiment.

FIGS. 1 and 2 show a first embodiment which explains the principles of the invention. The housing 5 of the resonator 1 is constructed from a bottom 6, a frame-shaped central portion 7 and a lid 8. FIG. 1 shows a cut I—I indicated in FIG. 2. It passes through the frame-shaped central portion 7 in the vicinity of the conducting layer 9 which serves for transporting the first potential. The frame-shaped central portion 7 frames and surrounds a crystal 2 which is connected to the frame-shaped central portion 7 by means of a connecting brace 28. The frame-shaped central portion 7 and the crystal 2 are advantageously made from one piece, e.g. a quartz crystal, wherein a free location 44 is removed in a manner already described. The cut surface shown in FIG. 1 passes through the conducting layer 9 of the frame-shaped central portion 7, wherein one can see that an interruption 26 subdivides this conducting layer 9 in such a fashion that a sealed housing region 25 is produced. The largest fraction of the conducting layer 9 is connected to the first potential of the vertical conducting surface 18. This region is connected by the electrode lead 31 to the electrode 3 on the upper side of the crystal 2. The conducting layer 10 (see FIG. 2) is located on the lower side of the frame-shaped central portion 7 and applies the second potential to the lower electrode 4. This conducting layer 10, has an interruption 26' extending in such a fashion that the vertical conducting surface 18 of the first potential is separated. This interruption 26' is indicated with the dashed line in FIG. 1, since it is located on the back side of the frame-shaped central portion 7.

The sealing surfaces 13 and 14 form a sealed housing region 25 in which the crystal 2 is located. This sealed housing region 25 is formed via the sandwich-type housing 5 construction comprising the bottom 6, the frame-shaped central portion 7 and lid 8. The conducting layers 9 and 10 are joined correspondingly with conducting layers 9' and 10' of the lid 8 and the floor 6 in such a fashion that a hermetically sealed housing region 25 is created about the crystal 2.

In order to make such a component SMD-capable, it was necessary to configure it in such a fashion that both potentials of electrodes 3 and 4 can be separately connected to conducting tracks 23 and 23' of the circuit board 22. This goal is achieved via the above mentioned interruption 26 of the conducting layers 9 and 9' as well as the interruption 26' of the conducting layers 10 and 10' with separate connection to conducting tracks 23, 23' of the circuit board 22. An electrical connection is created from the conducting track 23 on the right side of the component through the vertical conducting surface 18 of the bottom 6 to the conducting layer 9 of the frame-shaped central portion 7. The conducting surface 18 is connected to the conducting track 23 of the circuit board at the foot 21 of the bottom 6 by a solder connection 24. In this fashion, the first potential is applied to electrode 3. The second potential is separated therefrom and located on the left side of the component. It is correspondingly passed from the conducting track thereof 23' via an additional solder connection 24. The interruptions 26 and 26' cause the sealing surfaces 13 and 14 to lie at different potentials. A different configuration of these interruptions as that shown is, however, conceivable. The potentials must only be separated, but without forming a gap in the sealing surfaces 13 and 14. In this manner, a resonator 1 of sandwich-type construction is produced with which no wires or through-contacts are required. The metallized surfaces 9, 9', 10, 10' alone of the stacked housing components 5, 6, 7 facilitate both the sealing of a housing portion 25 as well as separation of the two potentials.

Windows 32 and 33 are provided in the conducting layers 9' and 10' of the bottom 6 and of the lid 8 for vibration-capable suspension of the crystal 2. This vibration-capable suspension, having an associated free space 39 can, however, also be created by processing the thickness of the active crystal surface 2, as can be seen in this embodiment. Following this thickness processing, the electrodes 3 and 4 are introduced and connected to the conducting layers 9 and 10 for connection to the first and second potentials.

The cut representation of FIG. 2 corresponds to line II—II of FIG. 1, wherein crystal 2 and electrodes 3 and 4 are cut, but not the connecting brace 28 and the electrode lead 31. The following embodiments are also constructed according to the principle shown, wherein additional advantages are achieved with the associated configurations.

The details of a second embodiment are shown in FIGS. 3–5b. This embodiment differs from the first embodiment in that the crystal 2 is connected to the frame-shaped central portion 7 by means of two connecting braces 29 and 30, and the thickness of the crystal is not processed or only processed to an insignificant extent. The free space 39 is then created in this embodiment via the windows 32 and 33.

Figure 3:
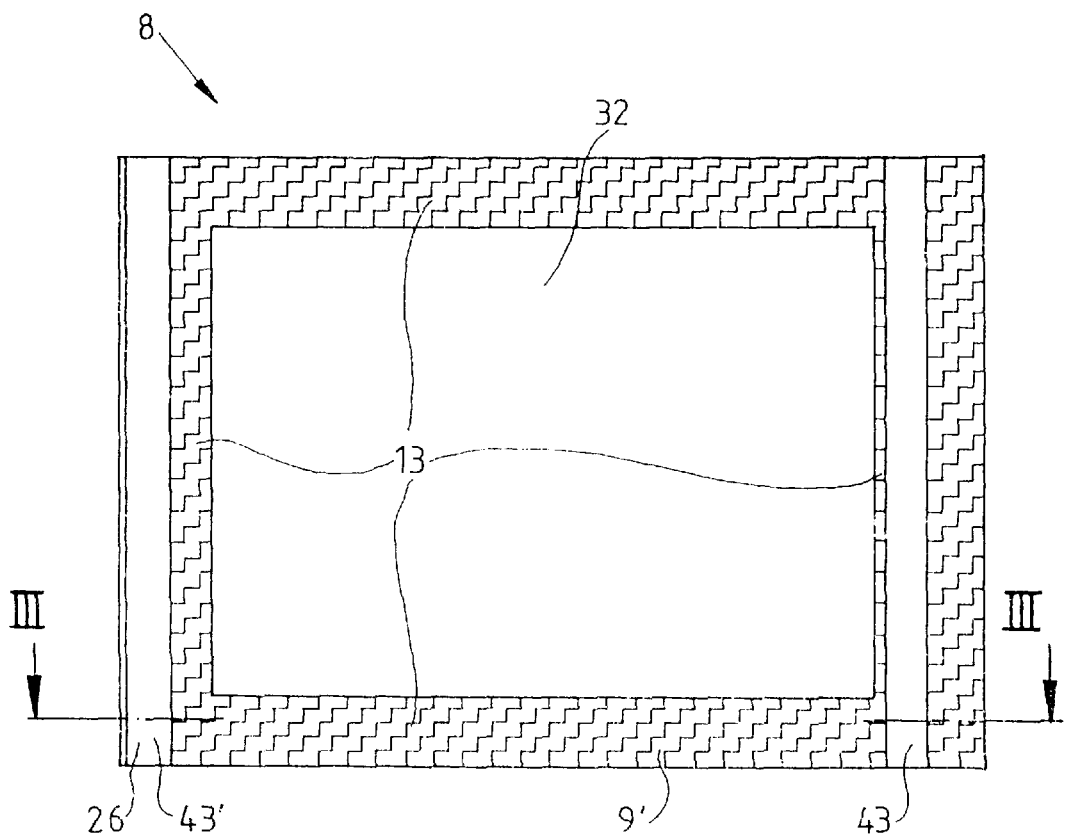
FIG. 3 shows a plan view of a lid.
Figure 3A:
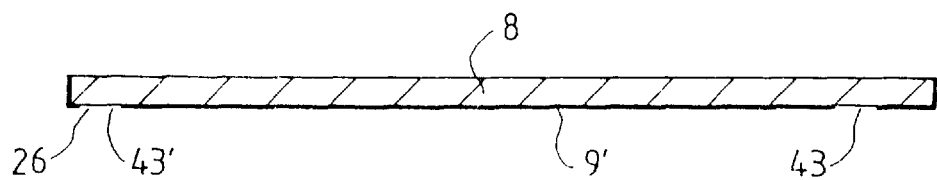
FIG. 3a shows a cross-sectional view of the lid of FIG. 3.

Improvements have also been introduced in the second embodiment. FIGS. 3 and 3a show the lid 8 of the second embodiment. 3a thereby shows the cut III—III of FIG. 3. The lower side of the lid 8 supports a conducting layer 9' corresponding to that described above and having a window 32. For reasons of clarity, the conducting layer 9 visible in the view of FIG. 3 is indicated with wavy lines. The interruption 26 is thereby visible which serves for separating the potentials in the manner described. Further interruptions 43, 43', with the latter being effected as a widening of the interruption 26, correspond to the associated interruptions 43, 43' of the conducting layer 9 of the frame-shaped central portion 7. Their function will be described below. Reference symbol 13 indicates the sealing surface which cooperates with the central portion 7 to effect sealing between the lid 8 and the frame-shaped central portion 7.

Figure 4:
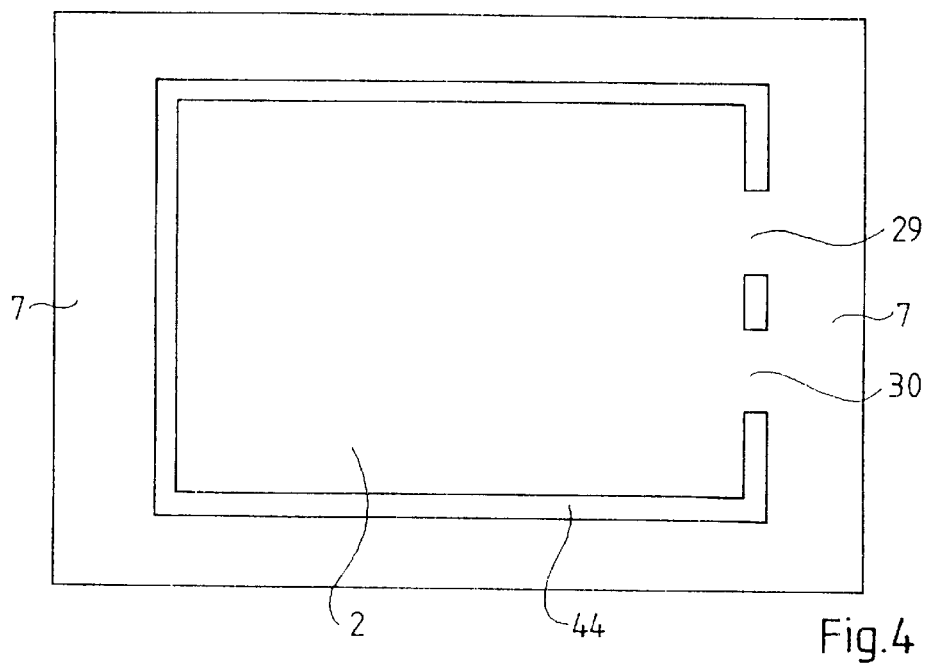
FIG. 4 shows a first plan view of a frame-shaped middle component.
Figure 4A:
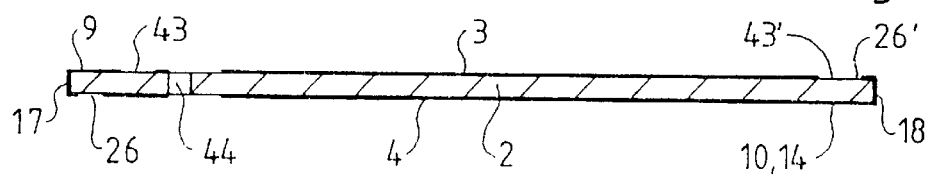
FIG. 4a shows a cross-sectional view of the frame-shaped middle component of FIG. 4.
Figure 4B:
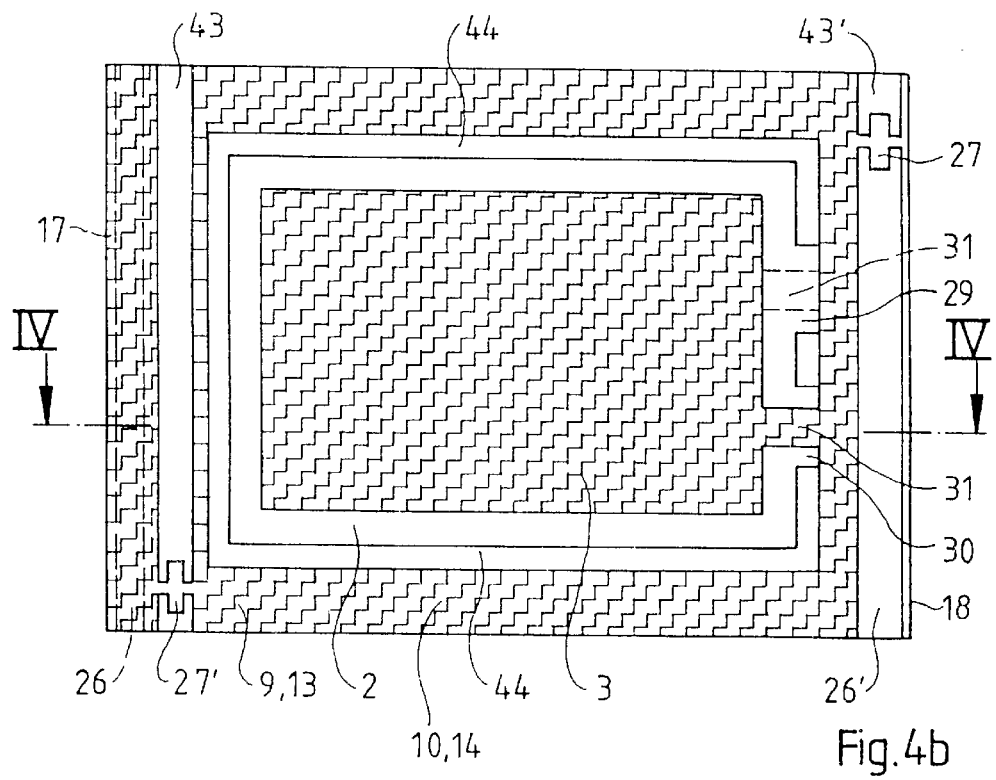
FIG. 4b shows a second plan view of the frame-shaped middle component of FIGS. 4 and 4a, FIG. 5 shows a first plan view of a bottom of a second embodiment.

FIGS. 4a and 4b show the frame-shaped central portion 7, wherein FIG. 4 represents a quartz plate which does not yet have a conducting layer, wherein the active crystal surface 2 has, however, already been processed by generating the opening 44. The active crystal surface 2 is connected to the frame-shaped member 7 via the connecting braces 29 and 30. FIG. 4b shows the frame-shaped central portion 7 after introduction of the conducting layer 9 which simultaneously creates the sealing surface 13 with the lid 8 already described above. The conducting layer 10 is located below the frame-shaped central portion 7 shown and likewise creates the sealing surface 14 with the bottom 6 which is to be described below. In contrast to the embodiment described above, in this embodiment the electrode lead 31 for the upper electrode 3 is located on a connecting brace 30 and the electrode lead 31 for the electrode 4 is located on the other connecting brace 29. This configuration avoids undesirable resonances in the leads. Clearly, other connections are possible for the active crystal surface 2. This depends on the desired type of vibrational resonance in each particular case and on the angle at which the crystal is cut when producing the blank.

Another special feature of the second embodiment is an interruption 43 between the two conducting layers 9 and 9'. Components 27' can be disposed in this interruption 43 and are circuited in series with the crystal 2. Another additional interruption 43' is also provided for which enlarges the interruption 26' in such a fashion that one or a plurality of additional elements 27 can be added, disposed in parallel to crystal 2. In this fashion, conducting tracks, coils, or capacitors can be additionally integrated into the resonator and it is thereby possible to completely or partially integrate a quartz filter into the housing 5 of the resonator 1.

Figure 5:
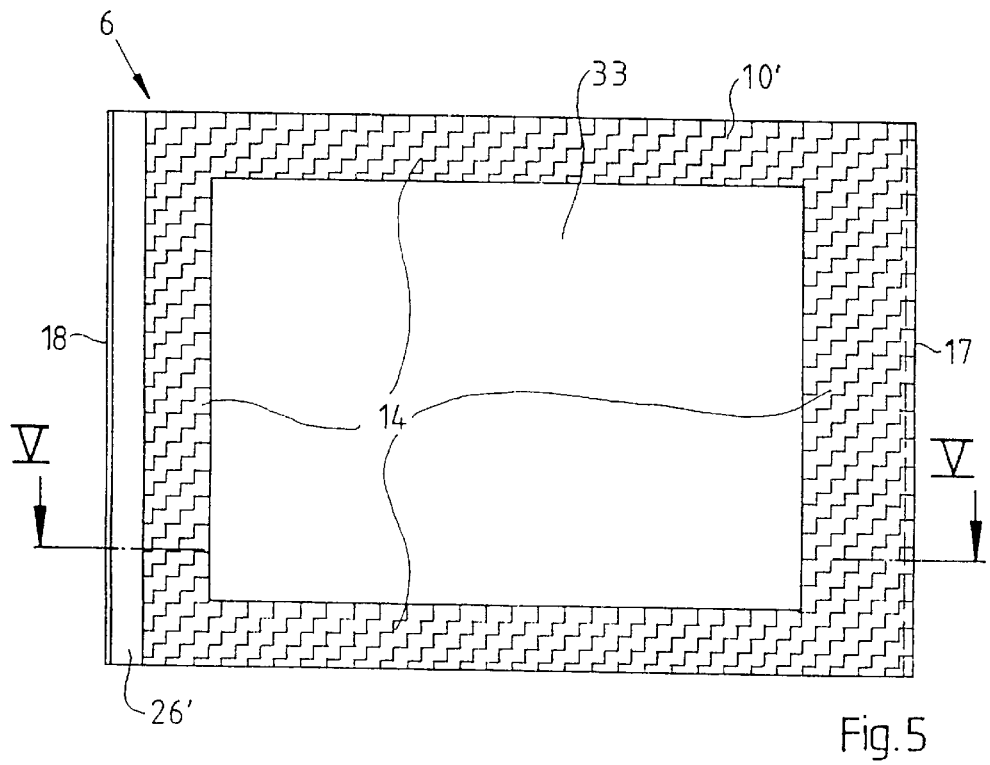
FIG. 5a shows a cross-sectional view of a bottom according to the second embodiment in accordance with FIG. 5.
FIG. 5b shows a second plan view of the bottom of a second embodiment in accordance with FIGS. 5 and 5a, FIG. 6 shows a housing component of a third embodiment for illustration of the assembly.
Figure 5A:
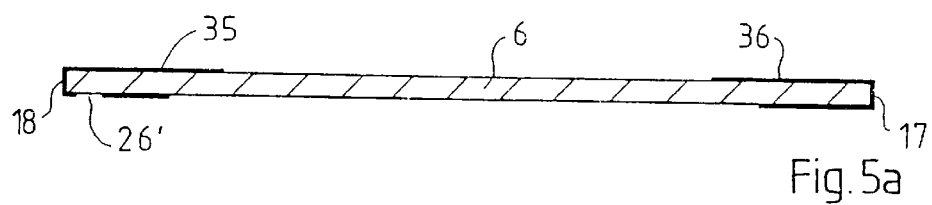
Figure 5B:
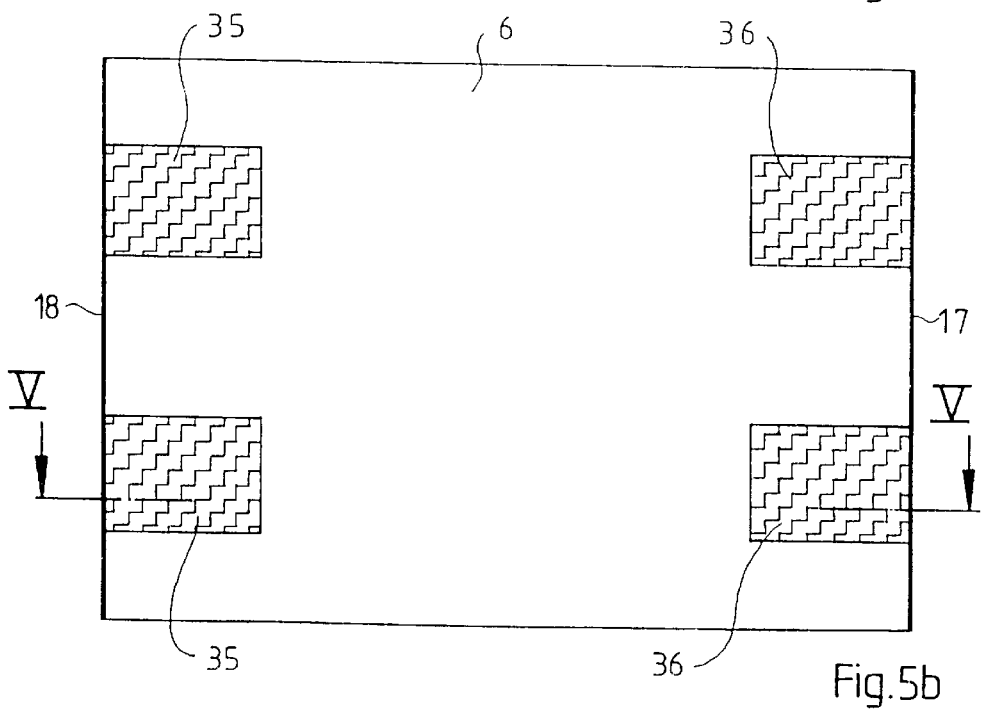

FIGS. 5, 5a and 5b show the bottom 6 of the second embodiment. FIG. 5 shows the upper side of the bottom 6, wherein the conducting layer 10' is configured in such a fashion that it corresponds to the conducting layer 10 of the frame-shaped central portion 7. This correspondence must be realized in the vicinity of the sealing surface 14 and in the contact region. Otherwise, additional separations 43 and 43' are also possible in this case. These are, however, not shown. FIG. 5a shows a cut V—V through the bottom 6. Connections are located on the lower side of the bottom, wherein, this embodiment has two separate connections 35 and 36. Clearly, a plurality of such connections can serve, in a different embodiment such as that of FIG. 8, to connect four potentials. The two separate connections 35 and 36 shown herein pass, via two vertical conducting surfaces 17 and 18, to the upper side of the bottom 6 at which the conducting layer 10' for the second potential is located (see also FIGS. 1, 2, 4a and 4b). The interruption 26' separates, however, the conducting surface 18 which serves to connect the conducting layer 9 (see FIG. 1) of the frame-shaped central portion 7 to the connector for the upper electrode 3. In contrast thereto, the conducting surface 17 leads to the lower electrode 4 via the conducting layer 10 and 10'.

Figure 6:
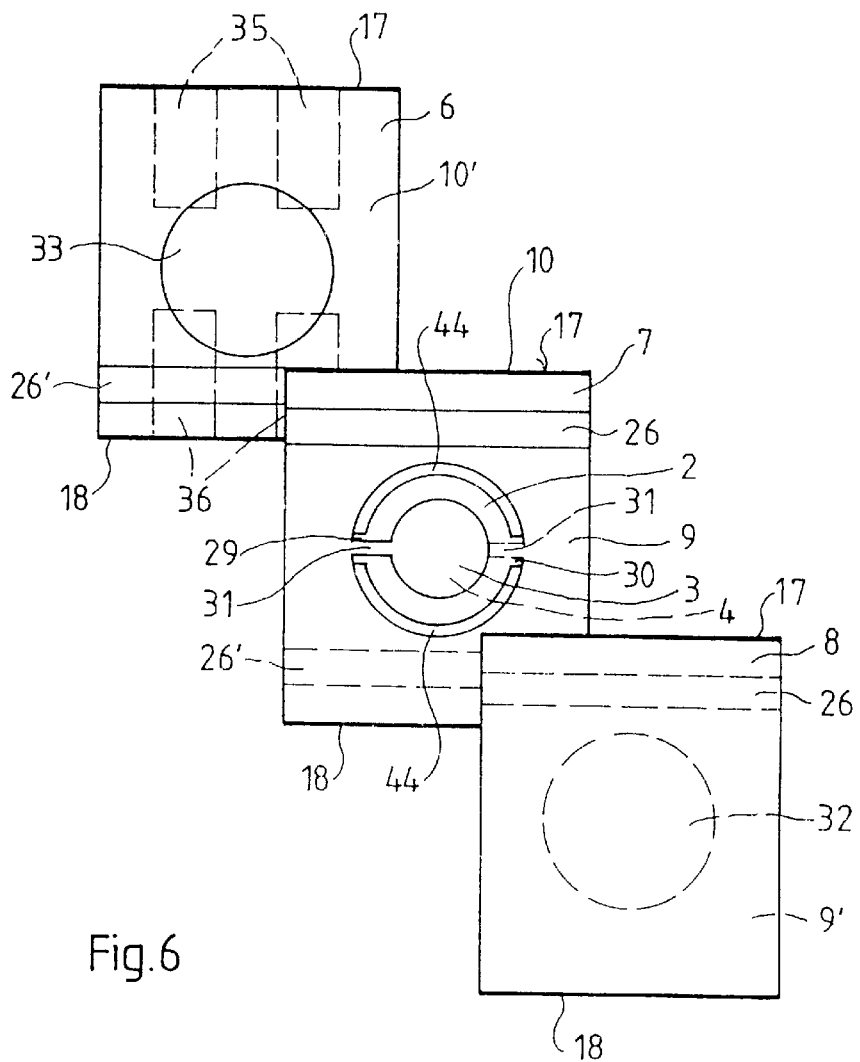

FIG. 6 shows housing portions of a third embodiment for illustrating the assembly. In this embodiment, the crystal 2 is round and has two oppositely disposed connecting braces 29 and 30 so that the opening 44 subtends approximately two times 175 degrees. The bottom 6 has the conducting layer 10' on its upper side having a window 33 which is round in this embodiment. The conducting layer 10' is furthermore provided with an interruption 26' which corresponds to the associated interruption 26' of the layer 10 of the frame-shaped central portion 7. This central portion 7 has the conducting layer 9 on its upper side with the interruption 26 which, for its part, corresponds to the interruption 26 of the layer 9' of the lid 8. This layer 9' has, for its part, a window 32 having, as does window 33, the size of opening 44. When stacking the bottom 6, the frame-shaped central portion 7, and the lid 8, a connection is thereby established from the electrode 3 via the electrode lead 31 and the conducting surface 18 to the connection 36. The electrode 4 disposed below the crystal 2 is connected via its electrode lead 31, the layers 10 (see FIG. 7) and 11 and the conducting surface 17 to the connection 35. The two potentials are separated from each other by interruptions 26 and 26'. The configuration of these interruptions 26 and 26' does not compromise the sealed housing region surrounding the opening 44. The remaining reference symbols correspond to components which have previously been mentioned in the preceding embodiments.

Figure 7:
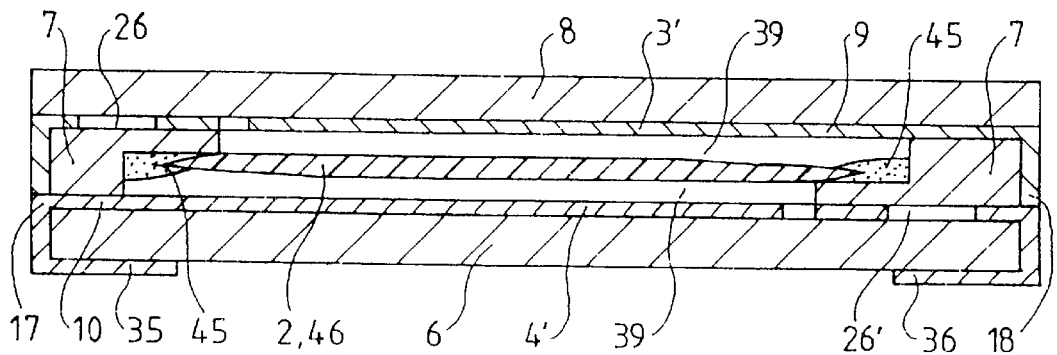
FIG. 7 shows a fourth embodiment with some alternative features.

FIG. 7 shows a fourth embodiment having alternative features. This embodiment has a frame-shaped central portion 7 in which a lens-shaped quartz crystal 46 is mounted by means of a glue connection 45. A lens-shaped quartz crystal 46 is particularly suited for frequencies less than 12 MHz. The frame-shaped central portion 7 has a conducting surface 18 on an outer edge and a conducting surface 17 on another outer edge. The bottom 6 has connections 35 and 36, wherein the connection 35 leads via the conducting surface 17 and the conducting layer 10 to the lower electrode 4'. The connection 36 leads via the conducting surface 18 and the conducting layer 9 to the upper electrode 3'. In this embodiment, the electrodes 3' and 4' are not disposed on the crystal 2, rather are located on the bottom 6 and on the lid 8. A configuration of this kind leads to a greater frequency stability and long term stability. Interruptions 26 and 26' separate the two potentials from each other. Instead of the interruption 26, the conducting surfaces 17 on the frame-shaped central portion 7 could be eliminated, with these missing conducting surfaces 17 effectively generating the interruption 26. Clearly, this component could also be configured as a unit having a plurality of stacked resonators. In this case, an intermediate bottom would be appropriately disposed between the individual resonator electrodes. This third embodiment combines a plurality of differing features. Clearly, this does not mean that they are only possible in the combination shown. The various features of all embodiments shown can be combined with each other in differing manners.

Figure 8:
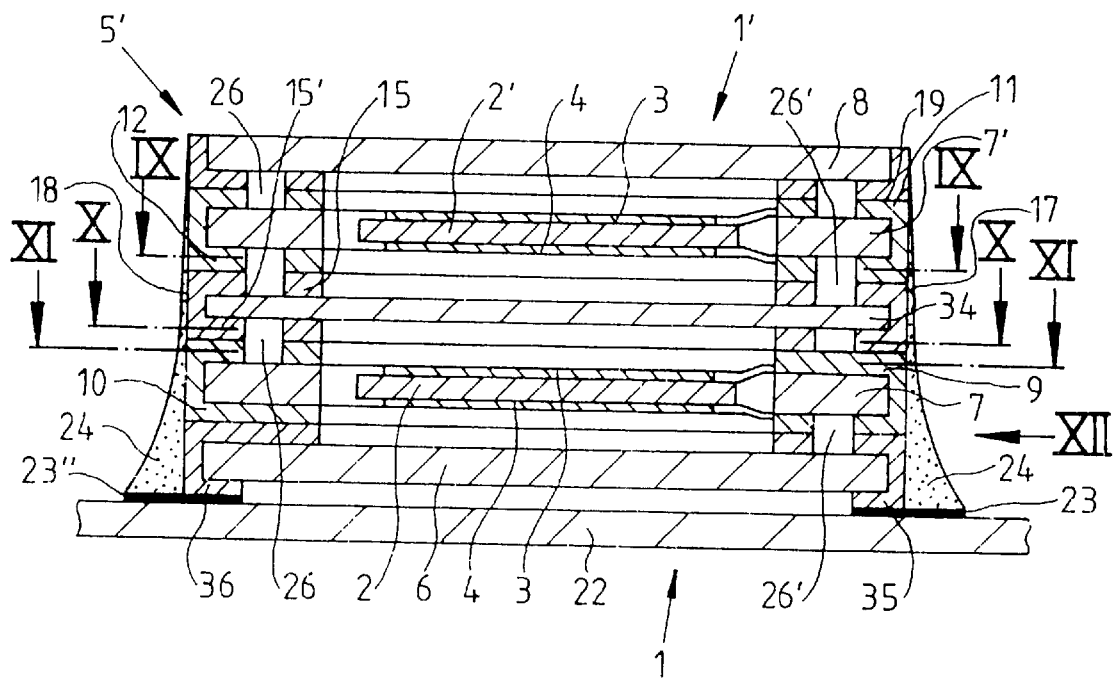
FIG. 8 shows a fifth embodiment having two resonators stacked one above another.
Figure 9:
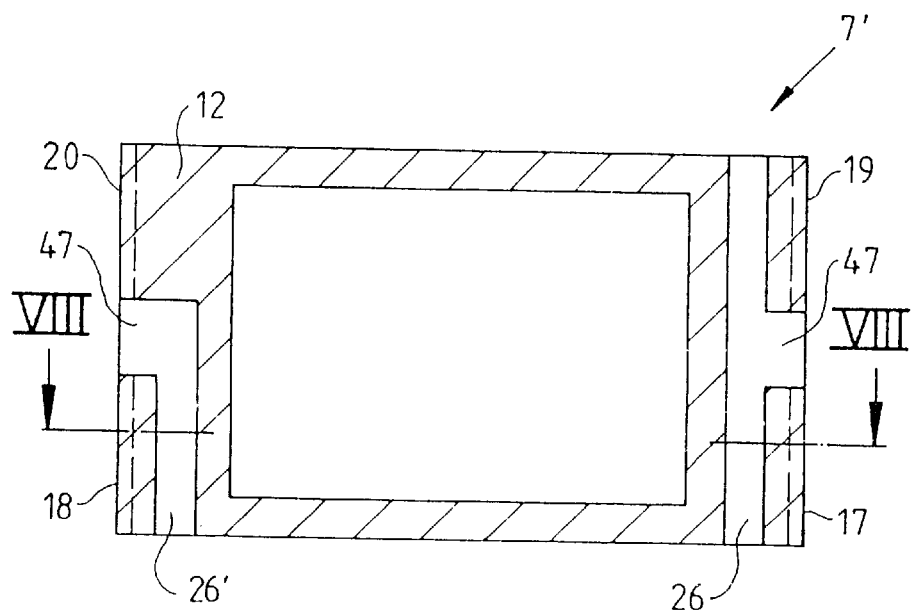
FIG. 9 shows a cut through the upper central portion of FIG. 8.
Figure 10:
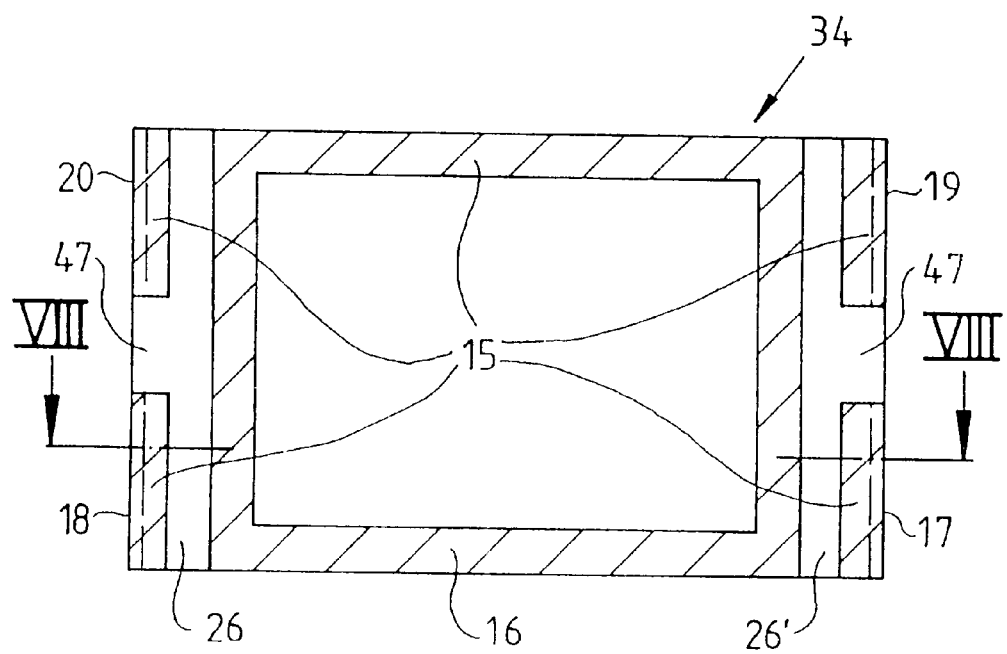
FIG. 10 shows a cut through the intermediate bottom of FIG. 8.
Figure 11:
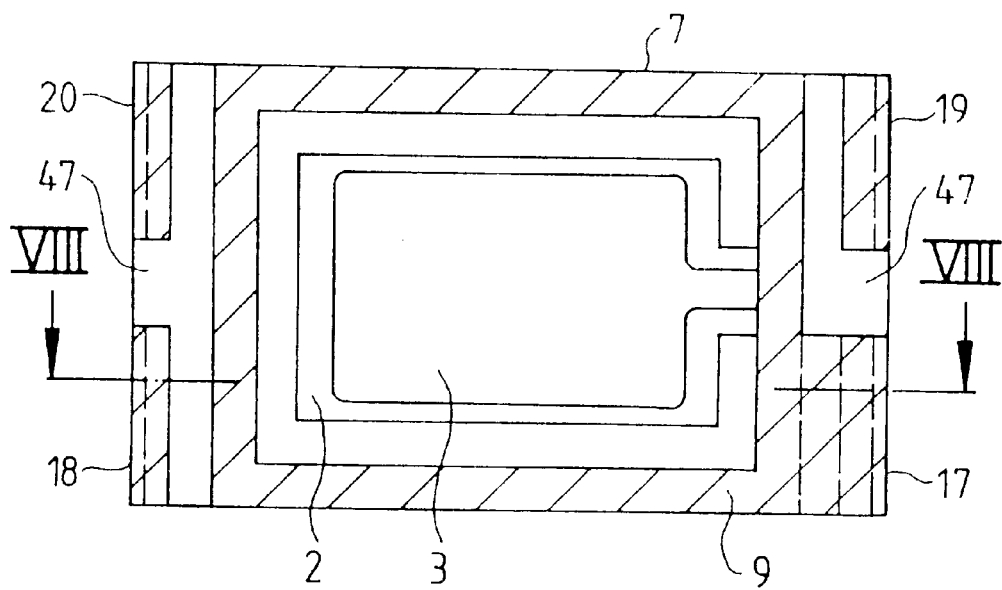
FIG. 11 shows a cut through the lower middle central portion of FIG. 8
Figure 12:
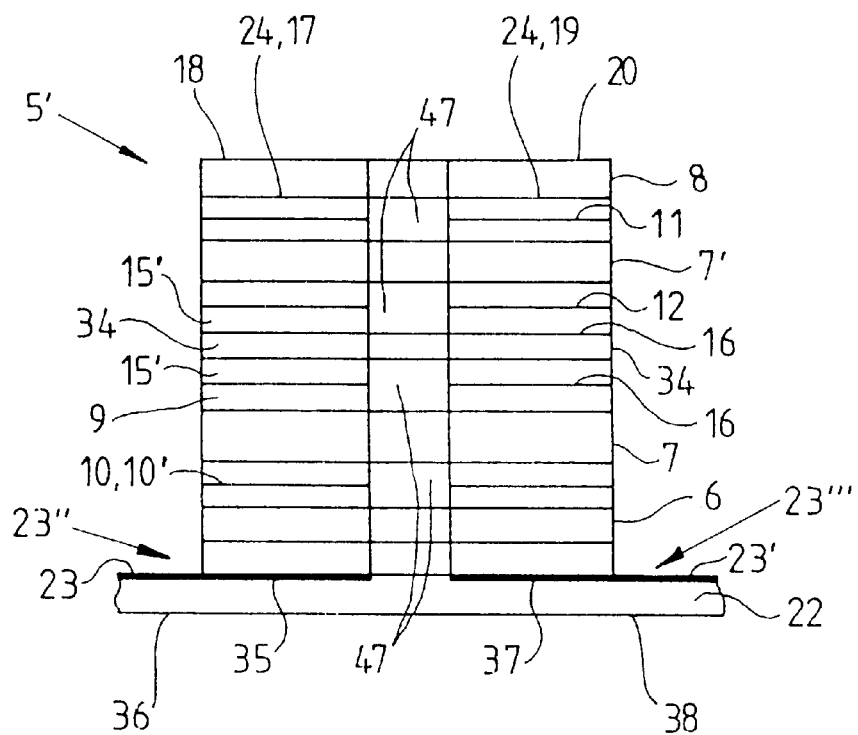
FIG. 12 shows a side view of the fifth embodiment and FIG. 13 shows a sixth embodiment.

FIGS. 8 through 12 show a fifth embodiment having two resonators 1, 1' stacked one above another located in a housing 5'. FIGS. 8 through 11 are cut representations, wherein the cuts of FIGS. 9, 10 and 11 are indicated in FIG. 8. The location of the cut of FIG. 8 is indicated in FIGS. 9 through 11. The roman numerals of the cuts correspond to the arabic numerals of the figures. FIG. 12 shows a side view which is likewise indicated in roman numerals with an arrow in FIG. 8.

In this embodiment, each resonator 1 and 1' has separate connections, 35 and 36 as well as 37 and 38, to the circuit board 22. The connection 35 thereby leads from the conducting track 23 via the conducting surface 17 and the conducting layer 9 to the upper electrode 3 of the crystal 2. The connection 36 leads from the conducting track 23" via the conducting surface 18 and the conducting layer 10 to the lower electrode 4 of the crystal 2. The connection 37 leads from the conducting track 23' via the conducting surface 19 and the conducting layer 11 to the upper electrode 3 of the crystal 2'. Finally, the connection 38 leads from the conducting track 23'" via the conducting surface 20 and the conducting layer 12 to the lower electrode 4 of the crystal 2'. In order to effect these four separate connections 35 through 38, additional interruptions 47 must be provided for over and above interruptions 26 and 26' which cooperate with interruptions 26 and 26' in such a fashion that the conducting side surfaces of the component are subdivided into four conducting surfaces 17 through 20, wherein each of these surfaces 17 through 20 is connected to one conducting layer 9 through 12 in the manner described above. The cut IX shown in FIG. 9 thereby shows that the conducting surface 20 is connected through to the conducting layer 12. The conducting surface 19 on the upper side of resonator 1' is correspondingly connected to the conducting layer 11. FIG. 11 shows how the conducting surface 17 is connected to the conducting layer 9, wherein the conducting surface 18 is correspondingly connected to the conducting layer 10. An intermediate bottom is disposed between the resonators 1 and 1' having conducting layers 15 and 15' configured as shown in FIG. 10. The sealing surfaces 16 of the intermediate bottom 34 are separated from the potentials by interruptions 26 and 26'. The two potentials of each side are, for their part, separated by the additional interruptions 47. In this fashion, the potentials are simply passed on without having contact occur to the larger sealing surface 16. Clearly, the conducting surfaces 17 and 18 can also be eliminated along with the corresponding components of the conducting layer, since a connection in the upward direction is not necessary. It would also be possible to eliminate the interruptions 26, 26', 47 proximate the intermediate bottom 34 at those locations where they are absent in the corresponding surfaces 9, 10, 11, 12 of the bordering frame-shaped central portions 7, 7'. The embodiment shown has been chosen to provide better handling and universal applicability for the intermediate bottom 34 due to the symmetry at all sides and to facilitate a likewise symmetric soldering 24 onto the component in a upwardly leading fashion.

Clearly, a stack can be produced having more than two resonators, wherein additional separations 47 would then be required. It is also conceivable that the sides which are not yet provided with conducting surfaces 17 through 20 be correspondingly used to facilitate more contacts. It is also possible for the frame-shaped central portions 7 and 7' to be stacked upon each other without an intermediate bottom 34. In this case, all crystals would be located in a sealed housing region.

In a fifth embodiment shown, the connectors for both resonators 1 and 1' are separately passed to the circuit board. Corresponding connections between the conducting surfaces 17 through 20 and the conducting layers 9 through 13 facilitate housings with resonators connected in parallel or in series as well as circuits with additional components 27.

Figure 13:
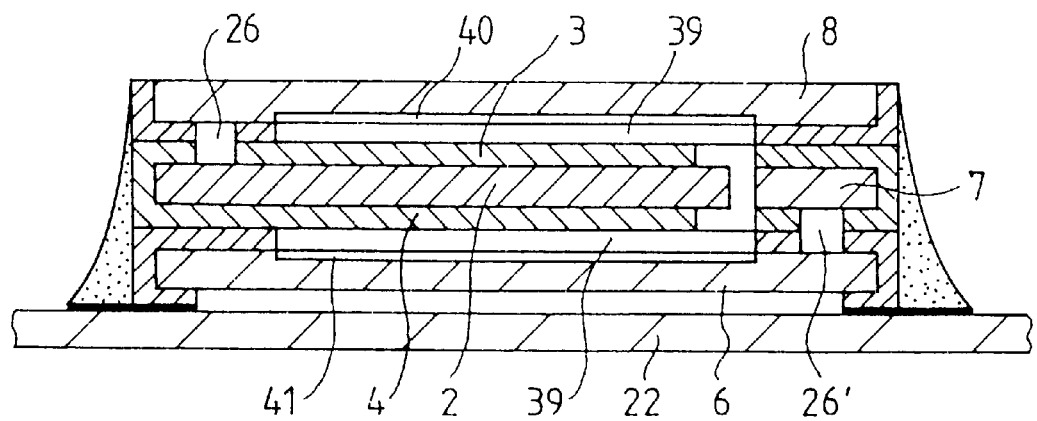

FIG. 13 shows a sixth embodiment which is different from that of FIG. 2 in that the electrode 2 has the thickness of the frame-shaped central portion 7 and tub-shaped recesses 40 and 41 in the lid 8 and the bottom 6 generate the free space 39.

The six embodiments shown in the figures are only exemplary combinations of features. Clearly, arbitrary feature combinations are possible.

RESONATOR WITH CRYSTAL

List of Reference Symbols

| | |
|---|---|
| 1,1' | resonator |
| 2,2' | crystal (or active crystal surface) |
| 3,3' | electrode (upper) |
| 4,4' | electrode (lower) |
| 5,5' | housing |
| 6 | bottom |
| 7,7' | frame-shaped central portion (e.g. crystal plate) |
| 8 | lid |
| 9,9' | conducting layer, first potential |
| 10,10' | conducting layer, second potential |
| 11 | conducting layer, third potential |
| 12 | conducting layer, fourth potential |
| 13 | sealing surface, upper side of central portion |
| 14 | sealing surface, lower side of central portion |
| 15,15' | conducting layers of the intermediate bottom |
| 16 | sealing surface of the intermediate bottom |
| 17,18,19,20 | sealing surfaces |
| 21 | foot of bottom |
| 22 | printed circuit board |
| 23,23',23",23''' | printed circuit board tracks |
| 24 | soldering |
| 25 | housing regions sealed by sealing surfaces |
| 26,26' | interruptions in a conducting layer |
| 27,27' | additional components |
| 28 | connecting brace (one) |
| 29,30 | connecting brace (two) |
| 31 | electrode lead |
| 32 | window (lid) |
| 33 | window (bottom) |
| 34 | intermediate bottom |
| 35,36,37,38 | separate connections |
| 39 | free space |
| 40,41 | tub-shaped recesses |
| 43,43' | additional interruptions of a conducting |

-continued

RESONATOR WITH CRYSTAL

List of Reference Symbols

| | |
|---|---|
| | layer |
| 44 | opening |
| 45 | glue connection |
| 46 | lens-shaped quartz crystal |
| 47 | additional interruptions of conducting layers for separation of four potentials |

What is claimed is:

1. A resonator for SMD mounting to a circuit board, the resonator comprising:

a substantially plate-shaped bottom having a lower edge;

a frame-shaped central portion disposed above said bottom;

a crystal disposed within said frame-shaped central portion, said crystal mounted to said frame-shaped central portion for vibration;

a plate-shaped lid disposed above said frame-shaped central portion;

a first conducting surface at a first potential, said first conducting surface extending from said lower edge upwardly along an outer side of said bottom, said first conducting surface soldering said bottom to the circuit board;

a second conducting surface at a second potential, said second conducting surface extending, in non-electrical contract with said first conducting surface, from said lower edge upwardly along an outer side of said bottom, said second conducting surface soldering said bottom to the circuit board;

a first conducting layer disposed on a lower side of said frame-shaped central portion, said first conducting layer having a first area electrically connected to said first conducting surface and a second area electrically connected to said second conducting surface, said first conducting layer having a first interruption for electrically isolating said first area from said second area;

a second conducting layer disposed at an upper side of said frame-shaped central portion, said second conducting layer having a third area electrically connected to said first conducting surface and a fourth area electrically connected to said second conducting surface, said second conducting layer having a second interruption for electrically isolating said third area from said fourth area;

a first electrode disposed above said crystal for exciting said crystal, said first electrode electrically connected to said third area;

a second electrode disposed below said crystal for exciting said crystal, said second electrode electrically connected to said second area; and means for sealing together said lid, said central portion, and said bottom into a sandwich-type housing having a sealed housing region containing said crystal, wherein said first and said second interruptions are disposed radially outside said sealed housing region.

2. The resonator of claim 1, wherein said second conducting layer is connected to said lid and said first conducting layer is connected to said bottom for effecting a sealing surface at an edge of said sealed housing region.

3. The resonator of claim 2, wherein said lid and said central portion are connected to each other by means of bonding.

4. The resonator of claim 2, wherein said bottom and said central portion are connected to each other by means of bonding.

5. The resonator of claim 1, wherein said first and said second conducting layers have additional interruptions outside of said sealed housing region.

6. The resonator of claim 5, further comprising additional components disposed in said additional interruptions.

7. The resonator of claim 1, wherein said crystal and said frame-shaped central portion are configured as a single component, wherein a first remaining connecting brace permits vibration of an active resonating surface of said crystal.

8. The resonator of claim 7, further comprising a second remaining connecting brace, wherein said first brace supports a first electrode lead and said second brace supports a second electrode lead.

9. The resonator of claim 1, wherein an active crystal surface is processed to achieve a thickness change.

10. The resonator of claim 9, wherein said thickness change creates a free space for vibration of said crystal.

11. The resonator of claim 1, wherein an active crystal surface is processed to effect a certain shape.

12. The resonator of claim 9, wherein an active crystal surface is processed to effect a desired frequency.

13. The resonator of claim 2, further comprising a fourth conducting layer disposed on a lower side of said lid said fourth conducting layer having a seventh area electrically connected to said third area and an eighth area electrically connected to said fourth area, said fourth conducting layer having a fourth interruption for electrically isolating said seventh area from that eighth area, said fourth interruption disposed above said second interruption.

14. The resonator of claim 13, wherein said lower conducting layer has a window proximate said crystal.

15. The resonator of claim 14, wherein said bottom has an upper conducting layer having a window proximate said crystal.

16. The resonator of claim 15, wherein a free space for vibration of said crystal is produced by said windows of said upper and said lower conducting layers.

17. The resonator of claim 1, wherein at least one of said bottom and said lid is made from a transparent material.

18. The resonator of claim 17, wherein at least one of said first and said second electrodes are post-processed using a laser after joining together said housing, to achieve precise frequency matching.

19. The resonator of claim 17, wherein at least one of said first and said second electrodes are post-processed using a flow discharge following joining together of said housing, to achieve precise frequency matching.

20. The resonator of claim 1, wherein said first and said second electrodes are disposed on said crystal.

21. The resonator of claim 1, wherein said first electrode is disposed on a lower side of said lid and said second electrode is disposed on an upper side of said bottom.

22. The resonator of claim 1, further comprising a second crystal within said housing.

23. The resonator of claim 22, further comprising a second frame-shaped central portion disposed between said bottom and said lid.

24. The resonator of claim 23, further comprising an intermediate bottom disposed between said frame-shaped central portion and said second frame-shaped central portion, said intermediate bottom having a third conducting surface for electrical connection between one of said crystal and said second crystal disposed thereabove, and the circuit board.

25. The resonator of claim 24, wherein said intermediate bottom has a fifth conducting layer on an upper and a sixth conducting layer on a lower side thereof to effect said sealed housing region, said fifth and said sixth conducting layers having interruptions outside of that sealed housing region.

26. The resonator of claim 22, further comprising a first connector connecting said crystal to the circuit board and a second connector connecting said second crystal to the circuit board.

27. The resonator of claim 22, wherein said crystal is for forming a first resonator and said second crystal is for forming a second resonator, said first and said second resonators connected in series.

28. The resonator of claim 22, wherein said crystal is for forming a first resonator and said second crystal is for forming a second resonator, said first and said second resonators connected in parallel.

29. The resonator of claim 1, wherein said bottom has a first tub-shaped recess and said lid has a second tub-shaped recess said first and said second recesses forming a free space for vibration of said crystal.

30. The resonator of claim 1, wherein said bottom, said central portion, and said lid are all made from a same quartz material as said crystal.

31. The resonator of claim 2, further comprising a third conducting layer disposed at an upper side of said bottom, said third conducting layer having a fifth area electrically connected between said first area and said first conducting surface and a sixth area electrically conducted between said second area and said second conducting surface, said third conducting layer having a third interruption for electrically isolating said fifth area from sixth area, said third interruption disposed below said first interruption.

32. A method for the manufacture of a resonator having a least one central portion comprising a crystal plate having two electrodes as well as a bottom and a lid, the method comprising the following steps:

a) freeing an active crystal surface, wherein at least one connecting brace remains to a frame-shaped central portion created thereby;

b) processing the active crystal surface to achieve desired mechanical dimensioning;

c) attaching a first conducting surface, for application of a first potential, to the bottom, said first conducting surface extending from a lower edge of the bottom upwardly along an outer side thereof, said first conducting surface soldering the bottom to a circuit board;

d) attaching a second conducting surface, for application of a second potential, to the bottom, said second conducting surface extending, in non-electrical contact with said first conducting surface, from the lower edge upwardly along an outer side of the bottom, said second conducting surface soldering the bottom to the circuit board;

e) applying a first conducting layer to a lower side of the central portion, said first conducting layer having a first area electrically connecting to said first conducting surface and a second area electrically connected to said second conducting surface, said first conducting layer having a first interruption for electrically isolating said first area from said second area;

f) applying a second conducting layer to an upper side of the central portion, said second conducting layer having a third area electrically connected to said first conducting surface and a fourth area electrically connected to said second conducting surface, said second conducting layer having a second interruption for electrically isolating said third area from said fourth area;

g) disposing a first electrode above the crystal for exciting the crystal, said first electrode electrically connected to said third area;

h) disposing a second electrode below said crystal for exciting said crystal, said second electrode electrically connected to said second area; and i) sealing together the lid, the central portion and the bottom into a sandwich-type housing having a sealed housing region contained said crystal, wherein said first and said second interruptions are disposed radially outside of said sealed housing region.

33. The method of claim 32, further comprising the steps of:

j) applying a third conducting layer to an upper side of said bottom, said third conducting layer having a fifth area electrically connected between said first area and said first conducting surface and a sixth area electrically connected between said second area and said second conducting surface, said third conducting layer having a third interruption for electrically isolating said fifth area from said sixth area, said third interruption disposed below said first interruption; and k) applying a fourth conducting layer to a lower side of said lid, said fourth conducting layer having a seventh area electrically connected to said third area and an eighth area electrically connected to said fourth area, said fourth conducting layer having a fourth interruption for electrically isolating said seventh area from said eighth area, said fourth interruption disposed above said second interruption.

34. The method of claim 32, further comprising post-processing at least one electrode through a transparent housing component using a laser.

35. The method of claim 32, further comprising post-processing at least one electrode through a transparent housing component using a flow discharge.

36. The method of claim 32, wherein housing components are sealed using vacuum underpressure and joined to each other using an additional joining step.

37. A resonator for SMD mounting to a circuit board, the resonator comprising:

a substantially plate-shaped bottom having a lower edge;

a frame-shaped central portion disposed above said bottom;

a crystal disposed within said frame-shaped central portion, said crystal mounted to said frame-shaped central portion for vibration;

a plate-shaped lid disposed above said frame-shaped central portion;

a first conducting surface at a first potential, said first conducting surface extending from said lower edge upwardly along an outer side of said bottom, said first conducting surface soldering said bottom to the circuit board;

a second conducting surface at a second potential, said second conducting surface extending, in non-electrical contract with said first conducting surface, from said lower edge upwardly along an outer side of said bottom, said second conducting surface soldering said bottom to the circuit board;

a first conducting layer disposed on a lower side of said frame-shaped central portion, said first conducting layer having a first area electrically connected to said first conducting surface and a second area electrically connected to said second conducting surface, said first conducting layer having a first interruption for electrically isolating said first area from said second area;

a second conducting layer disposed at an upper side of said frame-shaped central portion, said second conducting layer having a third area electrically connected to said first conducting surface;

a first electrode disposed above said crystal for exciting said crystal, said first electrode electrically connected to said third area;

a second electrode disposed below said crystal for exciting said crystal, said second electrode electrically connected to said second area; and means for sealing together said lid, said central portion, and said bottom into a sandwich-type housing having a sealed housing region containing said crystal, wherein said first interruption is disposed radially outside said sealed housing region.

* * * * *